United States Patent [19]
Minami et al.

[11] 3,988,596
[45] Oct. 26, 1976

[54] VOLTAGE MEMORY DEVICE

[75] Inventors: Shunji Minami, Katano; Shunzo Oka, Hirakata, both of Japan

[73] Assignee: Matsushita Electric Industrial Co., Ltd., Osaka, Japan

[22] Filed: Mar. 14, 1975

[21] Appl. No.: 558,557

Related U.S. Application Data

[63] Continuation-in-part of Ser. No. 340,347, March 12, 1973, Pat. No. 3,889,133.

[30] Foreign Application Priority Data

| Apr. 1, 1974 | Japan | 49-37138 |
| Apr. 1, 1974 | Japan | 49-37139 |
| Apr. 1, 1974 | Japan | 49-37140 |
| Apr. 1, 1974 | Japan | 49-37141 |
| Apr. 1, 1974 | Japan | 49-37675[U] |

[52] U.S. Cl. ............................ 307/246; 307/247 A; 307/251; 307/304; 317/148.5 R; 317/101 C
[51] Int. Cl.² ................. H03K 17/00; H03K 17/60
[58] Field of Search ............... 307/246, 247 A, 251, 307/304, 251; 328/151; 317/148.5 R, 101 C

[56] References Cited
UNITED STATES PATENTS

| 3,571,620 | 3/1971 | Hansen | 307/304 |
| 3,789,262 | 1/1974 | Backwinkel | 307/238 |
| 3,889,133 | 6/1975 | Oka et al. | 307/251 |

*Primary Examiner*—Stanley D. Miller, Jr.
*Assistant Examiner*—B. P. Davies
*Attorney, Agent, or Firm*—Burgess Ryan and Wayne

[57] ABSTRACT

A voltage memory device is disclosed wherein the gate of a MOS field-effect transistor is connected to one terminal of a capacitor and to an input voltage terminal through an input resistor and through the contacts of a reed relay while the source is connected to an output terminal and an output resistor, the input resistor being inserted in order to determine the charging time of the capacitor. When the reed relay is actuated, the capacitor is charged or discharged depending upon whether the input voltage terminal is connected to a positive or negative voltage supply source so that the output voltage increases or decreases. When the reed relay is de-energized, the output voltage remains at the same level. The voltage memory device has a function similar to that of the conventional variable resistors, but it eliminates the use of any sliding part and is operable at a relatively low voltage in a reliable and dependable manner. The voltage memory may be used in an automatic control system.

10 Claims, 11 Drawing Figures

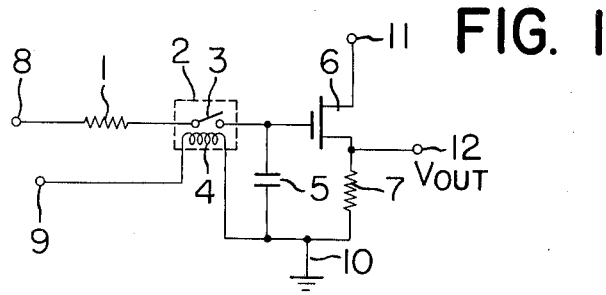
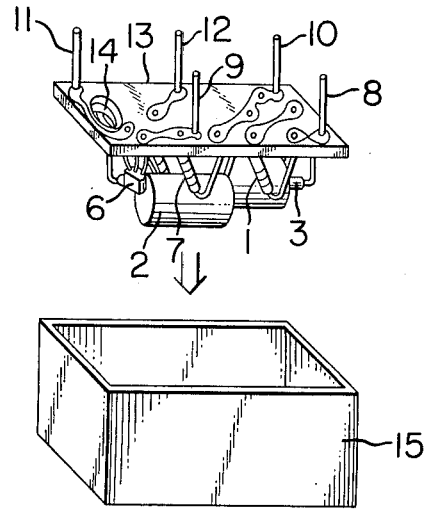

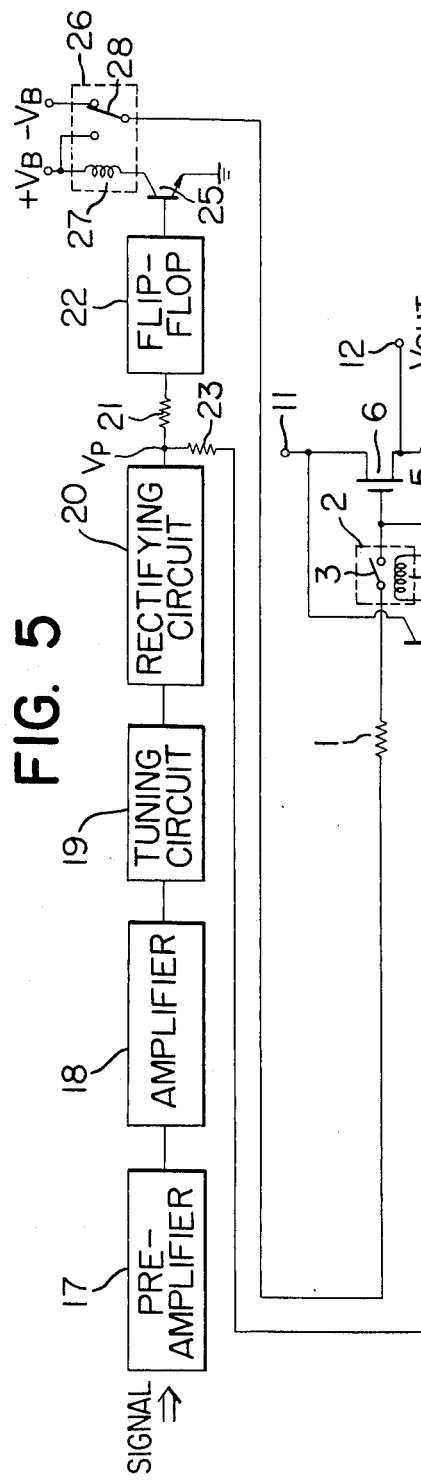
FIG. 5
FIG. 6
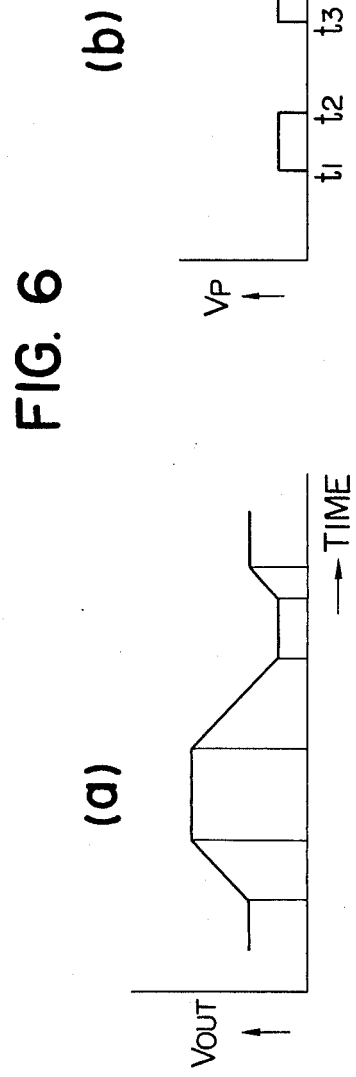

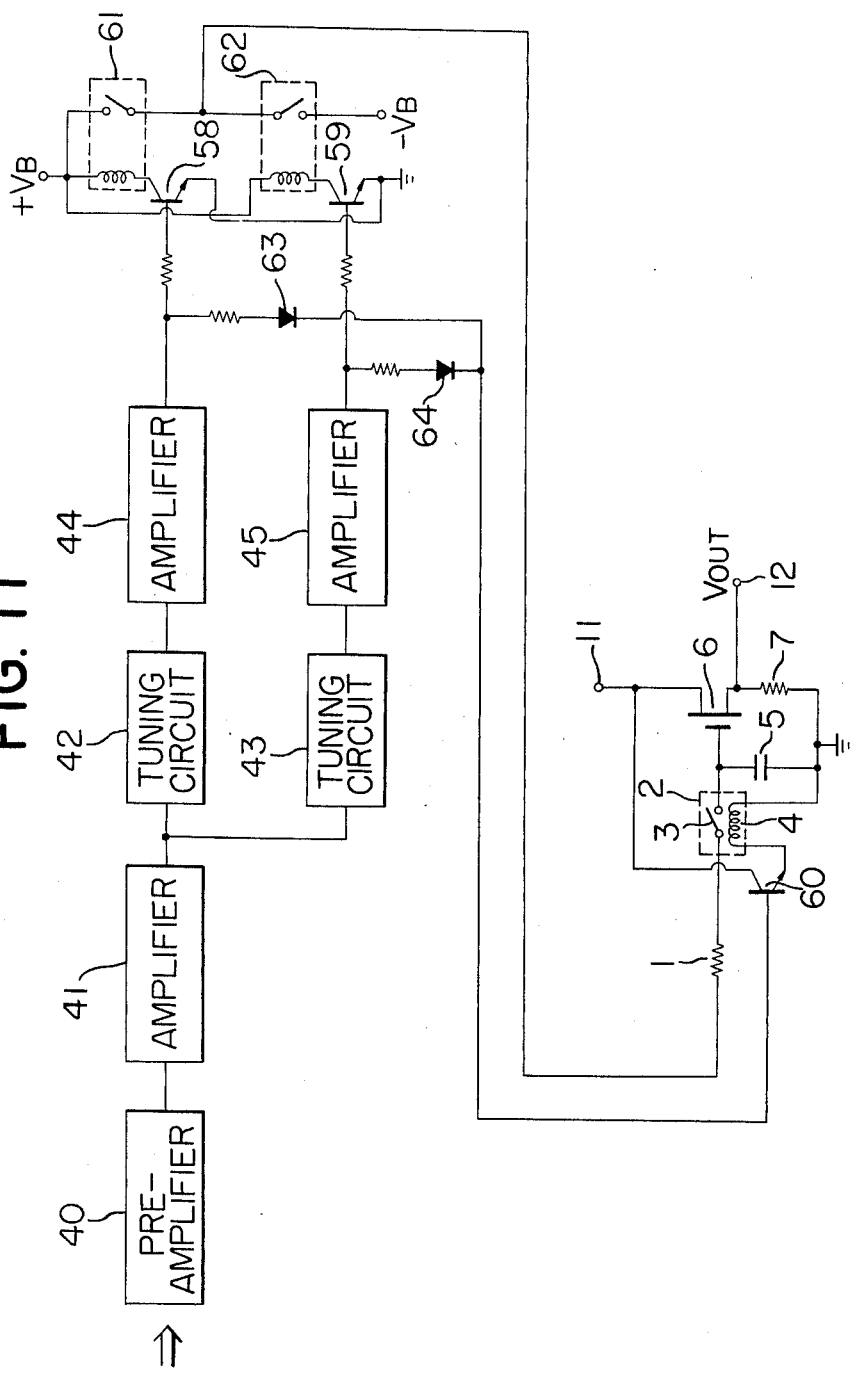

VOLTAGE MEMORY DEVICE

This application is a continuation in part of U.S. patent application Ser. No. 340,347 filed Mar. 12, 1973, now U.S. Pat. No. 3,889,133.

BACKGROUND OF THE INVENTION

The present invention relates to a voltage memory device of the type in which the output voltage is in proportion to the voltage charged across a capacitor.

In the voltage memory devices of the type in which the voltage held or stored is dependent upon the position of a brush of a variable resistor, the held or stored voltage tends to change due to the unsatisfactory contact between the brush and a resistor due to their wear and abrasion. Therefore, the correct voltage cannot be derived. Moreover, the resistance of the variable resistor changes depending upon the ambient temperature, so that the held or stored voltage inevitably changes.

SUMMARY OF THE INVENTION

One of the objects of the present invention is therefore to provide an electronic voltage memory device which has a function equivalent to that of the conventional variable resistors.

Another object of the present invention is to provide a voltage memory device which may be incorporated in a control system using only one control signal or a plurality of control signals.

A further object of the present invention is to provide a voltage memory device which may hold voltage for a sufficiently long time.

To attain the above and other objects, according to the present invention, the relay contact of a reed relay is connected through an input resistor to the input voltage terminal and one relay coil terminal is connected to the driving voltage input terminal while the other relay coil terminal is grounded. One terminal of the capacitor is connected to the other contact terminal of said reed relay and the other terminal is grounded. The gate of MOS field-effect transistor is connected to the other said terminal of said reed relay and to said one terminal of said capacitor. The drain is connected to the drain electric source terminal and the source is connected to the output terminal and is grounded through the output resistor. When the reed relay is actuated, the capacitor is charged or discharged depending upon whether the input voltage terminal is connected to a positive or negative voltage supply source so that the output voltage derived from the output terminal increases or decreases.

Therefore, the present invention provides electronic voltage memory devices which have no sliding part and function in a manner substantially similar to that of the conventional variable registers and may be used in an automatic control system.

The above and other objects, features and advantages of the present invention will become more apparent from the following description of some preferred embodiments thereof, taken in conjunction with the accompanying drawings.

BRIEF DESCRIPTION OF THE DRAWINGS

FIG. 1 is a circuit diagram of a first embodiment of the present invention;

FIG. 2 is an exploded perspective view thereof;

FIG. 3 is a perspective view of a subassembly thereof prior to being packed into a case;

FIG. 4 is a perspective view of a completed assembly thereof;

FIG. 5 is a block diagram of a second embodiment of the present invention;

FIG. 6 shows the waveforms used for the explanation of the mode of operation thereof;

FIGS. 10 and 11 are block diagrams of a fourth and fifth embodiments, respectively, of the present invention.

DESCRIPTION OF THE PREFERRED EMBODIMENTS

First Embodiment, FIGS. 1–4

Figure 7:
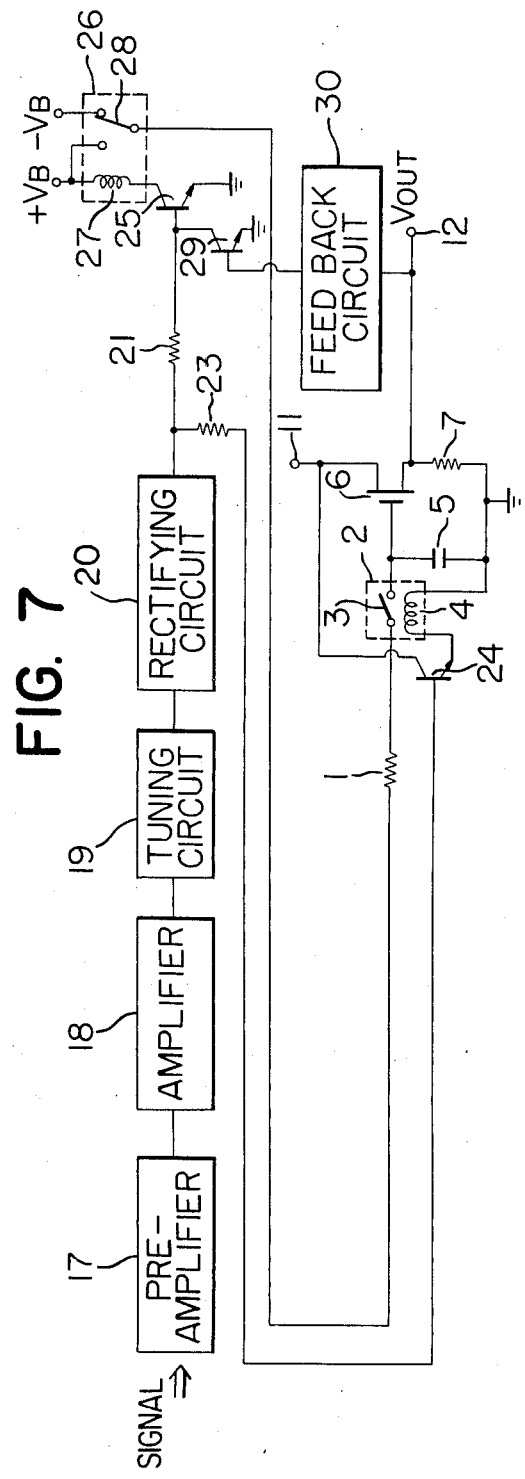
FIG. 7 is a block diagram of a third embodiment of the present invention.

Referring to FIG. 1, an input voltage terminal 8 to which is applied a positive or negative voltage is connected through an input resistor 1 and relay contacts 3 of a reed relay 2 to the gate of a MOS field-effect transistor 6. A drive voltage input terminal 9 is connected through a coil 4 of the reed relay 2 to a grounding terminal 10. A capacitor 5 is interconnected between the gate of the MOS field-effect transistor 6 and the grounding terminal. The drain of the transistor 6 is connected to a drain terminal while the source is connected to an output terminal 12 and to the grounding terminal 10 through an output resistor 7.

Next the mode of operation will be described. When the drive voltage is applied to the input terminal 9, the coil 4 of the reed relay 2 is energized so that the relay contacts 3 thereof are closed. When the positive voltage is applied to the input terminal 8, the current flows through the input resistor 1 and the relay contacts 3 into the capacitor 5 so that the voltage across the capacitor 5; that is, the voltage applied to the gate of the transistor 6 increases. As a result, the transistor 6 is turned on so that the current flows from the drain electric source terminal 11 through the drain and source of the transistor 6 into the output resistor 7. The DC output voltage which is the product of the magnitude of the current flowing through the resistor 7 and the value of the output resistor 7 is derived from the output terminal 12. Since the magnitude of the drain current is dependent upon the voltage applied to the gate of the transistor, the output DC voltage is a function of the gate voltage.

When the relay coil 4 is de-energized, the relay contacts 3 are opened so that the charging of the capacitor 5 is interrupted. Therefore, the output voltage remains at a constant value which is dependent upon the gate voltage; i.e., the voltage across the capacitor 5 at the instant when the relay coil 4 is de-energized.

When the negative voltage is applied to the input terminal 8 and the relay coil 4 is energized again, the relay contacts 3 are closed so that the capacitor 5 is discharged. As a result, the gate voltage decreases so that the output voltage also decreases. When the relay coil 4 is de-energized, the relay contacts 3 are opened so that the discharge of the capacitor 5 is interrupted. The voltage across the capacitor 5 remains at a certain value so that the output voltage remains also at a certain value.

As described above, when the positive or negative voltage is applied to the input terminal 8 during the time when the relay coil 4 is kept energized, the output voltage may be varied over the range from the point at which the transistor 6 is cut off to the point where the transistor 6 is saturated. When the relay coil 4 is de-energized, the relay contacts 3 are opened so that the voltage across the capacitor 5 remains at a certain level. As a result, the output voltage remains at a certain level depending upon the gate voltage. This means that the voltage is stored. In the instant embodiment, the value of the input resistor 1 determines the charging time of the capacitor 5.

Next referring to FIGS. 2-4, the assembly or packaging of the voltage memory device for improving the charge retaining ability of the capacitor 5 that is, the memory holding ability of the voltage memory device, will be described hereinafter. The terminals of the input resistor 1 are inserted into holes 1a and 1b formed through a printed circuit board 13; the terminal of one of the relay contacts 3 is inserted into a hole 3a; terminals of the relay coil 4 are inserted into holes 4a and 4b; one terminal of the capacitor 5 which is to be grounded is inserted into a hole 5a; the drain and source terminals of the MOS field-effect transistor 6 are inserted into holes 6a and 6b, respectively; and the terminals of the output resistor 7 are inserted into holes 7a and 7b, respectively. These terminals are joined in a suitable manner, for instance, by soldering to their corresponding conductors printed on the undersurface of the board 13 (See FIG. 3). Within a relatively large hole 14 formed through the board 13, the other terminal of the relay contact 3, the other terminal of the capacitor 5 and the gate terminal of the transistor 6 are interconnected to each other in such a way that they may be prevented from making contact with the board 13. Thus, the circuit components are assembled as shown in FIG. 1. According to this packaging method, the adverse effects due to the surface leakage of the printed board 13 as well as the leakage caused by a relatively low insulating resistance of the printed board 13 may be substantially eliminated so that the capacitor 5 may retain its charge for a sufficiently long time. In other words, the memory or voltage holding ability of the voltage memory device may be remarkably improved.

Next, as shown in FIG. 3, the input terminals 8 and 9, the grounding terminal 10, the drain terminal 11 and the output terminal 12 are attached to the corresponding conductors on the printed board 13. Thereafter, the subassembly shown in FIG. 3 is inserted into a case 15, and is molded with a suitable insulating material 16 such as epoxy resin, silicon rubber or the like as shown in FIG. 4 so that the surface leakage as well as the leakage caused by moisture may be positively prevented. Therefore, the degradation of the charge holding ability of the capacitor 5 may be prevented.

Second Embodiment, FIGS. 5 and 6

Referring to FIG. 5, a control system comprises a pre-amplifier 17, an amplifier 18, a tuning circuit 19, and a rectifying circuit 20 all connected in series in the order named. The output terminal of the rectifying circuit 20 is connected to a flip-flop 22 through a resistor 21 and to the base of a first switching transistor 24 through a resistor 23. The output of the flip-flop 22 is connected to the base of a switching transistor 25, and the collector of the transistor 25 is connected to a $+V_B$ terminal through a coil 27 of a relay 26 while the emitter is grounded. One of the two stationary contacts of the relay 26 is connected to the $+V_B$ terminal while the other, to a $-V_B$ terminal, and a movable contact is connected to the input resistor 1 of the voltage memory device. The emitter of the first switching transistor 24 is connected to the relay coil 4 of the reed relay 2 while the collector is connected to the drain of the MOS field-effect transistor 6. Identified reference numerals are used to designate similar parts throughout the figures.

Next, with further reference to FIG. 6, the mode of operation of the second embodiment will be described. The input signal as shown in FIG. 6(b) is applied at time $t_1$ to the preamplifier 17, and is amplified by both the amplifiers 17 and 18. A predetermined signal is derived by the tuning circuit 19 and is rectified by the rectifier 20. The output from the rectifying circuit 20 is applied to the base of the first switching transistor 24 so that the latter is turned on. The output from the rectifying circuit 20 is also applied to the flip-flop 22 to reverse its state. More particularly, when the output from the rectifying circuit 20 is applied to the flip-flop 22 when the latter's output is 0, the output from the flip-flop 22 changes to 1, so that the second switching transistor 25 is also turned on. As a result, the relay coil 27 is energized so that the movable contact 28 of the relay 26 closes the stationary contact connected to the $+V_B$ terminal. Since the first switching transistor 24 is turned on, the relay coil 4 is energized so that the relay contacts 3 are closed. Therefore, the $+V_B$ terminal is connected to the capacitor 5 so that the latter is charged. As a result, the output voltage at the output terminal 12 increases as shown in FIG. 6(a).

At time $t_2$, the input signal disappears or is removed, the first switching transistor 24 is turned off so that the relay coil 4 is de-energized. The relay contacts 3 are opened so that the charging of the capacitor 5 is interrupted. Therefore, the output voltage $V_{out}$ remains at a raised level as shown in FIG. 6(a).

At time $t_3$, the input signal is applied again to the preamplifier 17 as shown in FIG. 6(b) so that the first switching transistor 24 is turned on again and the output from the flip-flop 22 changes to 0. The second switching transistor 25 is turned off so that the relay coil 27 is de-energized. Therefore, the movable contact 28 returns to its initial position to close the other stationary contact connected to the $-V_B$ terminal. That is, the capacitor 5 is connected to the $-V_B$ source so that it is discharged. Accordingly, the output voltage $V_{out}$ decreases as shown in FIG. 6(a). At time $t_4$, the input signal disappears so that the switching transistor 24 is turned off again. Therefore, the output voltage $v_{out}$ remains at a lower level as shown in FIG. 6(a).

In summary, according to the second embodiment of the present invention, the output voltage increases or decreases in response to a predetermined input signal applied to the preamplifier 17, and keeps increasing or decreasing as long the input signal lasts. When the input signal disappears, the output voltage remains at a raised or lowered level. In response to the next input signal, the mode of operation is reversed. That is, the output voltage starts, keeps decreasing or increasing and remains at a lowered or raised level as the input signal disappears. Therefore, the second embodiment of the present invention may be used as a remote control system for controlling, for instance, the volume of a television receiver or the like by a single control signal. In this case, when the control signal is applied, the volume increases or decreases, and remains at a desired level when the control signal disappears or is removed. Therefore, a volume control may be easily fabricated utilizing the device of the second embodiment.

Figure 9:
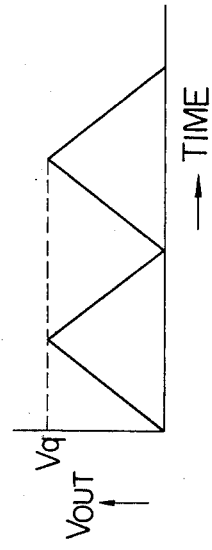
FIG. 9 shows the waveform used for the explanation of the mode of operation of the third embodiment.
Figure 8:
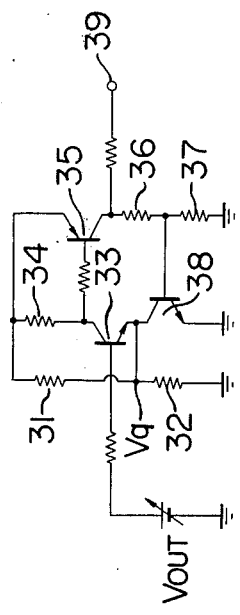
FIG. 8 is a detailed circuit diagram of a feedback circuit in FIG. 7.

Third Embodiment, FIGS. 7–9

The third embodiment of the present invention shown in block diagram in FIG. 7 is substantially similar in construction to the second embodiment described above except (a) that the flip-flop 22 of the second embodiment is removed so that the base of the second switching transistor 25 is directly coupled through the resistor 21 to the output terminal of the rectifier 20, (b) that a third switching transistor 29 with its collector connected to the base of the second switching transistor 25 is inserted; and (c) that a feedback circuit 30 is interconnected between the output terminal 12 of the voltage memory device and the base of the third switching transistor 29.

As the input signal is applied to the pre-amplifier 17, the output voltage $V_{out}$ at the terminal 12 increases in a manner substantially similar to that of the second embodiment. The output voltage is applied to the feedback circuit 30 shown in detail in FIG. 8. When the output voltage exceeds a voltage $Vq$ at the junction of voltage divider resistors 31 and 32, a transistor 33 is turned on. Current flows through a resistor 34 so that the voltage across the resistor 34 drops. Then a transistor 35 is turned on so that the current flows through resistors 36 and 37 connected in series. Due to the voltage drop across the resistor 37, a transistor 38 is also turned on so that the output signal appears at an output terminal 39 of the feedback circuit 30. In response to this output signal, the third switching transistor 29 is turned on so that the base of the second switching transistor 25 is grounded. Accordingly, the second switching transistor 25 is turned off so that the relay coil 27 is de-energized. The movable contact 28 returns to its initial position to close the stationary contact connected to the $-V_B$ terminal. The capacitor 5 is therefore discharged so that the output voltage $V_{out}$ decreases gradually. When the output voltage $V_{out}$ drops below the voltage which is almost zero because the transistor 33 is maintained in a conducting state, the transistor 33 is turned off so that the transistors 35 and 38 are also turned off. The output from the feedback circuit 30 becomes therefore 0 so that the third switching transistor 29 is turned off. Then the second switching transistor 25 is turned on again so that the relay coil 27 is energized to attract the movable contact 28 to close the stationary contact connected to the $+V_B$ terminal. Therefore, the output voltage $V_{out}$ starts increasing again.

Therefore, as far as the input signal is kept applied to the preamplifier 17, the output voltage $V_{out}$ repeatedly changes between the upper limit $Va$ which is determined by the voltage divider resistors 31 and 32 when the transistor 33 is turned off and the lower limit almost equal to zero, as shown in FIG. 9. As with the case of the second embodiment, the output voltage $V_{out}$ remains at the same level when the input signal disappears. When the next input or control signal is applied, the output voltage starts increasing or decreasing depending upon whether the output voltage was increasing or decreasing when the preceding input signal disappeared, and the output voltage $V_{out}$ changes between the upper and lower levels in the manner described above. It should be noted that the upper limit which is determined by the voltage divider 31 and 32 when the transistor 33 remains turned off must be smaller than the saturation voltage of the MOS field-effect transistor 6 in the voltage memory device.

In summary, according to the present invention, the output voltage changes repeatedly between the upper and lower levels as long as the input or control signal is applied to the pre-amplifier 17, and remains at a desired level when the control signal disappears. Therefore, the third embodiment of the present invention may be also used as a remote control system of the type using only one control signal for controlling, for instance, the volume or balance of a television receiver or the like, as with the case of the second embodiment.

Figure 10:
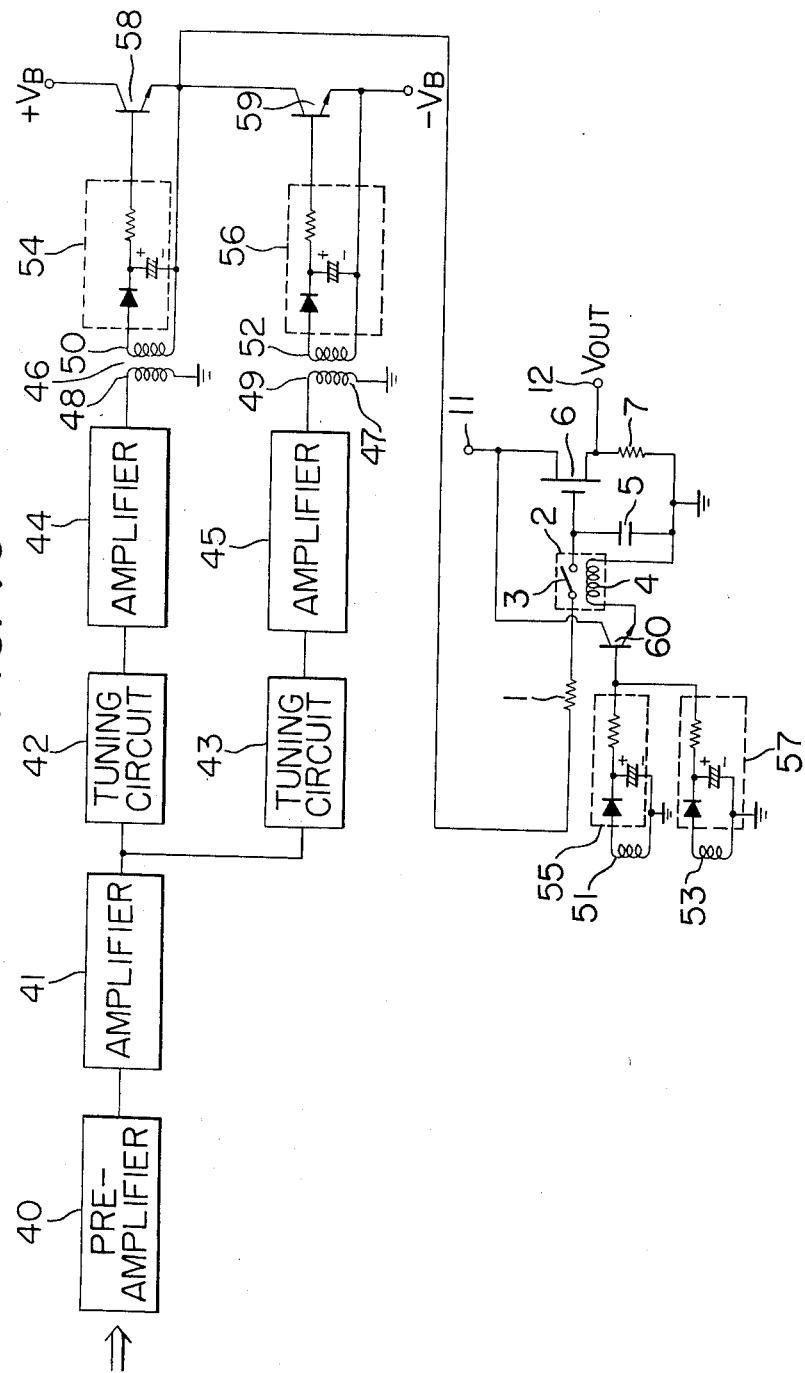

Fourth Embodiment, FIG. 10

In the fourth embodiment, a pre-amplifier 40 is connected to an amplifier 41 whose output is connected to the first and second tuning circuits 42 and 43. The first tuning circuit 42 is connected to an amplifier 44, which in turn is connected to a primary coil 48 of the first transformer 46. In like manner the second tuning circuit 43 is connected to an amplifier 45, which in turn is connected to a primary coil 49 of the second transformer 47. Secondary coils 50 and 51 of the first transformer 46 are connected to rectifying circuits 54 and 55, respectively, while secondary coils 52 and 53 of the second transformer 47 are connected to rectifying circuits 56 and 57, respectively. The rectifying circuits 54 and 56 are connected to the bases of switching transistors 58 and 59, respectively, while the rectifying circuits 55 and 57 are connected to the base of a switching transistor 60. The collector of the switching transistor 58 is connected to a $+V_B$ terminal while the emitter is connected to the collector of the second switching transistor 59 whose emitter is connected to a $-V_B$ terminal. The junction between the emitter of the first transistor 58 and the collector of the second switching transistor 59 is connected to the input resistor 1 of the voltage memory device. The emitter of the third switching transistor 60 is connected to the relay coil 4 of the reed relay 2 while the collector of transistor 60 is connected to the drain of the MOS field-effect transistor 6 in the voltage memory device.

The input signal is amplified by the pre-amplifier 40 and the amplifier 41. When the input signal has a frequency equal to that of the first tuning circuit 42, the current flows through the primary coil 48 of the first transformer 46 so that the induced current flows both the secondary coils 50 and 51 thereof. The induced currents are rectified by the rectifying circuits 54 and 55 and applied to the bases of the first and third switching transistors 58 and 60 so that the latter are turned on. The reed relay 2 is actuated so that the capacitor 5 is connected to the $+V_B$ terminal and is charged. As a result, the output voltage $V_{out}$ increases. When the input signal disappears, both the first and third switching transistors 58 and 60 are turned off so that the charging of the capacitor 5 is interrupted. As a result, the output voltage $V_{out}$ remains at a desired level.

When the input signal has a frequency equal to that of the second tuner 43, the second and third switching transistors 59 and 60 are turned on in a manner substantially similar to that described above. Therefore the capacitor 5 in the voltage memory device is connected to the $-V_B$ terminal so that it is discharged. Accordingly, the output voltage $V_{out}$ decreases.

As described above, according to the fourth embodiment, in response to the two different input or control signals, the output voltage may be increased or decreased and may be maintained at a desired level when the input signal is removed. Therefore, the device may be incorporated into an output voltage control.

Fifth Embodiment, FIG. 11

The fifth embodiment shown in FIG. 11 is substantially similar in construction and mode of operation to the fourth embodiment shown in FIG. 10 except (a) that the rectifying circuits 54, 55, 56 and 57 of the fourth embodiment are eliminated; (b) that the bases of the first and second switching transistors 58 and 59 are connected through resistors to the outputs of the amplifiers 44 and 45 respectively, (d) that the outputs of the amplifiers 44 and 45 are connected through resistors and diodes 63 and 64 for preventing the reverse current from flowing to to the base of the third switching transistor 60; and (e) that two relays 61 anad 62 are inserted with the junction between the movable contacts thereof connected to the input resistor 1 of the voltage memory device. The collectors of the first and second switching transistors 58 and 59 are connected to the $+V_B$ terminal through relay coils of the first and second relays 61 and 62, respectively, while the emitters thereof are grounded. The mode of operation of the fifth embodiment is clear from the description of the first and fourth embodiments so that no description shall be made in this specification.

As described above, the present invention provides electronic voltage memory devices having no sliding parts, and functioning in a manner substantially similar to that of the conventional variable resistors. Since a reed relay is used, the voltage memory device or the control system therefor may be actuated at a relatively low voltage. Furthermore, its operation is very reliable and dependable, because only when the coil of the reed relay is energized, is the output voltage varied. Therefore, the memory device including its control system in accordance with the present invention is best adapted for use as an automatic control system. In packaging, the contact terminal of the reed relay, one terminal of the capacitor and the gate of the MOS field-effect transistor are connected to each other in the relatively large diameter hole formed through the printed circuit board in such a way that they may be prevented from making contact thereto as described elsewhere. Therefore, the adverse effect of the surface leakage and the leakage due to the low resistance of the printed board may be eliminated so that the capacitor may hold the charge for a long time; that is, the memory holding ability of the voltage memory device may be considerably improved. As described above, the present invention provides a control system including a voltage memory device and using only one control signal, the output voltage from the voltage memory device increasing or decreasing as long as a control signal is applied, remaining at a desired level when the control signal is removed, and decreasing or increasing in response to the next control signal. As described above, according to the third embodiment of the present invention, the output voltage may be changed repeatedly between a predetermined upper limit level and a predetermined lower limit level. These control systems may be used as a remote control system for controlling, for instance, the volume of a television receiver or the like in the manner described hereinbefore. According to the second embodiment, the volume may be raised or lowered in response to the first control signal and then may be decreased or increased in response to the next control signal. According to the third embodiment, the volume may be changed repeatedly between a predetermined upper and lower levels. According to the fourth and fifth embodiments of the present invention, the output voltage may be increased or decreased in response to one of the two control signals. Thus, the present invention provides remote control systems which are very simple in operation when used for controlling, for instance, the volume of a television receiver or the like.

What is claimed is:
1. A voltage memory device comprising
  a. a reed relay having a contact terminal connected through an input resistor to an input voltage terminal said reed relay having a first relay coil terminal connected to a driving voltage input terminal and having a further relay coil terminal grounded;
  b. a capacitor having one terminal connected to the further contact terminal of said reed relay and having a further terminal grounded;
  c. a MOS field-effect transistor having a gate connected to said further contact terminal of said reed relay and to said first terminal of said capacitor, a drain being connected to a drain electric source terminal and having a source connected to an output terminal, an output resistor connecting said output terminal to ground, whereby the output voltage across said output resistor may be derived from said output terminal.

2. A voltage memory device as set forth in claim 1 further comprising a printed circuit board provided with conductors and terminal holes, wherein both terminals of said input resistor, both terminals of said relay coil of said reed relay, said first contact terminal thereof, said further terminal of said capacitor, and the drain and source terminals of said MOS field-effect transistor are inserted through their corresponding terminals holes formed through said printed board and electrically joined to the conductors printed on said printed board; and said further contact terminal of said reed relay, said first terminal of said capacitor and the gate of said MOS field-effect transistor are interconnected to each other in a relatively large diameter hole formed through said printed board.

3. A voltage memory device as set forth in claim 2 wherein said input resistor, said reed relay, said capacitor, said MOS field-effect transistor, and said output resistor which are all mounted on said printed board are molded with an insulating material.

4. A voltage memory device as set forth in claim 1 further comprising:
  a. a rectifying circuit for rectifying only a predetermined control signal; and
  b. a first and second switching elements actuable in response to the output from said rectifying circuit, said first switching element being connected to said input voltage terminal of said voltage memory device while said second switching element is connected to said driving voltage terminal thereof.

5. A voltage memory device as set forth in claim 4 further comprising a feedback circuit interconnected between said output terminal and the output of said rectifying circuit, said feedback circuit comprising a switching circuit for turning on or off the output from said rectifying circuit in response to the level of the output signal from said MOS field-effect transistor.

6. A voltage memory device as set forth in claim 4 further comprising a flip-flop interconnected between said rectifying circuit and said first switching element; and said first switching element comprising a single pole double throw switch in which the stationary contacts are connected to a positive and negative voltage supply sources, respectively, and the movable contact alternately connects either of said stationary contacts in response to the output from said rectifying circuit.

7. A voltage memory device as set forth in claim 1 further comprising a. a first and second rectifying circuits each of which rectifies a predetermined control signal;

b. a first and second switching elements actuable in response to the outputs from said first and second rectifying circuit, respectively, the junction between said first and second switching elements being connected to said input voltage terminal; and c. a third switching element actuable in response to either of the outputs from said first and second rectifying circuits, said third switching element being connected to said driving voltage terminal.

8. A voltage memory device as set forth in claim 7 wherein said first, second and third switching elements are transistors.

9. A voltage memory device as set forth in claim 1 wherein said first, second and third switching elements are relays.

10. A voltage memory device as set forth in claim 4, wherein said control signal is a periodic signal having a predetermined frequency, further comprising frequency selection means connected to said rectifying circuit for receiving said control signal and for passing to said rectifying circuit only signals of said predetermined frequency.

* * * * *

UNITED STATES PATENT OFFICE
CERTIFICATE OF CORRECTION

Patent No. 3,988,596　　　　　　　　Dated　October 26, 1976

Inventor(s)　Shunji Minami, et al

It is certified that error appears in the above-identified patent and that said Letters Patent are hereby corrected as shown below:

Column 7, line 22: "to" (second occurrence) should be deleted.

Column 10, line 13: "1" should be --7--.

Signed and Sealed this

Nineteenth Day of April 1977

[SEAL]

Attest:

RUTH C. MASON
*Attesting Officer*

C. MARSHALL DANN
*Commissioner of Patents and Trademarks*